United States Patent
Sundermeyer et al.

(10) Patent No.: US 10,164,636 B2
(45) Date of Patent: Dec. 25, 2018

(54) LEVEL SHIFTER CIRCUIT (71) Applicant: Fraunhofer-Gesellschaft zur Foerderung der angewandten Forschung e.V., Munich (DE)

(72) Inventors: Jan Sundermeyer, Nuremberg (DE); Norbert Weber, Weissenohe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 108 days.

(21) Appl. No.: 15/088,905

(22) Filed: Apr. 1, 2016

(65) Prior Publication Data
US 2016/0218714 A1 Jul. 28, 2016

Related U.S. Application Data (63) Continuation of application No. PCT/EP2014/071086, filed on Oct. 1, 2014.

(30) Foreign Application Priority Data

Oct. 2, 2013 (DE) .................. 10 2013 220 100

(51) Int. Cl.
*H03K 19/00* (2006.01)
*H03K 19/0185* (2006.01)
*G11C 7/10* (2006.01)
*H03K 19/003* (2006.01)
*H03K 5/003* (2006.01)

(52) U.S. Cl.
CPC ... *H03K 19/018507* (2013.01); *G11C 7/1084* (2013.01); *H03K 19/00369* (2013.01); *H03K 5/003* (2013.01)

(58) Field of Classification Search
CPC ............... H03K 19/00; H03K 19/0185; H03K 19/018528
See application file for complete search history.

(56) References Cited

U.S. PATENT DOCUMENTS

| | | | |
|---|---|---|---|
| 6,084,232 A | 7/2000 | Kimura et al. | |
| 6,084,478 A | 7/2000 | Mayampurath | |
| 6,329,881 B1 | 12/2001 | Tachigori et al. | |
| 6,552,605 B1 | 4/2003 | Yoon et al. | |
| 7,453,322 B2 | 11/2008 | Li et al. | |
| 7,948,270 B1 | 5/2011 | Evans et al. | |
| 8,598,906 B2 * | 12/2013 | van der Goes | .... H03K 19/0005 326/30 |

(Continued)

OTHER PUBLICATIONS

Layton, Kent D., "Analog Circuit Design at and Below VT + 2Vds,sat", Microelectrionics and Electronics Conference, RME. Ph.D. Research in, IEEE, PI, Jul. 1, 2007, pp. 213-216.

(Continued)

*Primary Examiner* — Hai L Nguyen
(74) *Attorney, Agent, or Firm* — Perkins Coie LLP; Michael A. Glenn (57) ABSTRACT

Embodiments of the present invention provide a level converter circuit with a resistor and a current adjustment circuit. The resistor is connected between an input and an output of the level converter circuit. The current adjustment circuit is configured to influence a current through the resistor such that an output voltage of the level converter circuit does not exceed a maximum allowable value.

9 Claims, 5 Drawing Sheets

(56) References Cited

U.S. PATENT DOCUMENTS

| 8,854,104 B2* | 10/2014 | Chung | H03L 5/00 |
| | | | 326/80 |
| 2002/0032893 A1 | 3/2002 | Brooks et al. | |
| 2007/0296456 A1 | 12/2007 | van der Goes et al. | |
| 2010/0286584 A1 | 11/2010 | Areskoug et al. | |
| 2012/0281991 A1 | 11/2012 | Sugimoto et al. | |

OTHER PUBLICATIONS

Potanin, V et al., "High-voltage-tolerant power supply in a low-voltage CMOS technology", Proceedings/ 2004 IEEE International Symposium on Circuits and Systems, May 21-269, 2004, May 23, 2004, pp. I-393.

* cited by examiner

LEVEL SHIFTER CIRCUIT

CROSS-REFERENCE TO RELATED APPLICATIONS

This application is a continuation of copending International Application No. PCT/EP2014/071086, filed Oct. 1, 2014, which is incorporated herein by reference in its entirety, and additionally claims priority from German Application No. 102013220100.1, filed Oct. 2, 2013, which is also incorporated herein by reference in its entirety.

BACKGROUND OF THE INVENTION

Embodiments of the present invention relate to a level converter circuit. Further embodiments relate to an input circuit with input transistors and a level converter circuit coupled to the input transistors. Further embodiments relate to a method for operating a level converter circuit. Some embodiments relate to a level converter for fast CMOS input circuits.

For realizing fast data transmission (of e.g. more than 1000 Mbit per second) across lossy cables, increased transmission power is necessitated. However, modern CMOS technologies have the limitation that fast transistors (having a structural size of less than 90 nm) have a lower dielectric strength. This is in particular critical for receiver circuits since here level conversion has to be performed, which can, at high signal levels (of e.g. more than 1V), no longer be realized with fast transistors.

Two solutions for solving this problem are known. According to a first solution, high input voltages are completely avoided, such that fast transistors can be used. This results, however, in a reduction of the transmission power or severely restricts the wirings that would otherwise be possible. According to a second solution, voltage-proof, slower transistors that perform a suitable level conversion are used for the input stage. However, this restricts the maximum data rate.

Due to the low switching velocity of these transistors, the usage of voltage-proof transistors results in an input stage with low amplification and bandwidth. On the one hand, this distorts the signal further, such that more measures for bandwidth compensation have to be taken, on the other hand, low amplification results in a poorer signal-to-noise ratio, since more amplifier stages are necessitated and more noise is added at lower signal levels.

SUMMARY

According to a first embodiment, a level converter circuit may have: an input with a first terminal and a second terminal; an output with a third terminal and a fourth terminal; a first resistor connected between the first terminal and the third terminal; a second resistor connected between the second terminal and the fourth terminal; and a current adjustment circuit configured to influence a current through the first resistor and a current through the second resistor such that an output voltage of the level converter circuit does not exceed a maximum allowable value; wherein the current adjustment circuit is a current regulating circuit that is configured to regulate the current through the first resistor and the current through the second resistor based on the output voltage; wherein the current level circuit includes a first transistor and a second transistor, wherein the first transistor is configured to influence the current through the first resistor, and wherein the second transistor is configured to influence the current through the second resistor, wherein control voltages of the first transistor and the second transistor depend on the determined common mode level of the output voltage; wherein the first transistor and the second transistor are field-effect transistors, and wherein the current regulating circuit includes a common mode detector that is configured to determine a common mode level of the output voltage, wherein the common mode detector includes a voltage divider that is configured to provide the common mode level of the output voltage at a center of the voltage divider, wherein gates of the field-effect transistors are connected to the center of the voltage divider.

According to another embodiment, an input circuit may have: input transistors; and an inventive level converter circuit; wherein the input transistors are coupled to the output of the level converter circuit.

According to another embodiment, a method for operating a level converter circuit, wherein the level converter circuit includes an input with a first terminal and a second terminal, an output with a third terminal and a fourth terminal, a first resistor connected between the first terminal and the third terminal, a second resistor connected between the second terminal and the fourth terminal, and a current regulating circuit, wherein the current level circuit includes a first transistor and a second transistor, wherein the first transistor and the second transistor are field-effect transistors, wherein the current regulating circuit includes a common mode detector that is configured to determine a common mode level of the output voltage, wherein the common mode detector includes a voltage divider, wherein gates of the field-effect transistors are connected to the center of the voltage divider, may have the steps of: influencing a current through the first resistor and a current through the second resistor with the current regulating circuit such that an output voltage of the level converter circuit does not exceed a maximum allowable value; wherein, when influencing the current through the first resistor and the current through the second resistor, the current through the first resistor and the current through the second resistor are regulated by the current regulating circuit based on the output voltage; wherein the current through the first resistor is influenced by the first transistor, and wherein the current through the second resistor is influenced by the second transistor; wherein control voltages of the first transistor and the second transistor depend on the determined common mode level of the output voltage; wherein the common mode level of the output voltage is provided at a center of the voltage divider.

Embodiments of the present invention provide a level converter circuit with a resistor and a current adjustment circuit. The resistor is connected between an input and an output of the level converter circuit. The current adjustment circuit is configured to influence a current through the resistor such that an output voltage of the level converter circuit does not exceed a maximum allowable value.

The present invention is based on the idea of performing level conversion, e.g. from a high input level to a level acceptable for fast transistors by means of a level converter circuit comprising a resistor and a current adjustment circuit, wherein the resistor is connected between an input and an output of the level converter circuit, and wherein the current adjustment circuit is configured to influence a current through the resistor such that an output voltage of the level converter circuit does not exceed a maximum allowable value (e.g. a level acceptable for fast transistors).

Further embodiments provide an input circuit with input transistors and the above described level converter circuit. The level converter circuit comprises a resistor and a current adjustment circuit. The resistor is connected between an input and an output of the level converter circuit. The current adjustment circuit is configured to influence a current through the resistor such that an output voltage of the level converter circuit does not exceed a maximum allowable value. Here, the input transistors are coupled to the output of the level converter circuit.

Further embodiments provide a method for operating a level converter circuit. The level converter circuit comprises a resistor and a current adjustment circuit. The resistor is connected between an input and an output of the level converter circuit. The current adjustment circuit is configured to influence a current through the resistor such that an output voltage of the level converter circuit does not exceed a maximum allowable value. The method includes influencing a current through the resistor with the current adjustment circuit such that an output voltage of the level converter circuit does not exceed a maximum allowable value.

BRIEF DESCRIPTION OF THE DRAWINGS

Embodiments of the present invention will be detailed subsequently referring to the appended drawings, in which.

DETAILED DESCRIPTION OF THE INVENTION

In the following description of the embodiments of the invention, equal or similar elements are provided with the same reference numbers in the figures, such that their description is interchangeable in the different embodiments.

Figure 1A:
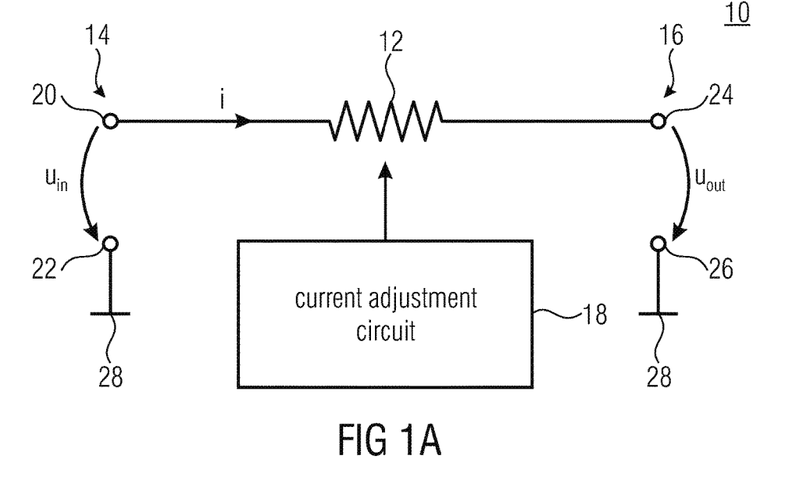
FIG. 1a is a schematic block diagram of a level converter circuit according to an embodiment of the present invention.

FIG. 1a shows a schematic block diagram of a level converter circuit 10 according to an embodiment of the present invention. The level converter circuit 10 comprises a resistor 12 connected between an input 14 and an output 16 of the level converter circuit 10. Further, the level converter circuit 10 comprises a current adjustment circuit 18 that is configured to influence a current i through the resistor 12 such that an output voltage $u_{out}$ of the level converter circuit 10 does not exceed a maximum allowable value.

In embodiments, the input 14 of the level converter circuit 10 can comprise a first terminal 20 and a second terminal 22, while the output 16 of the level converter circuit 10 can comprise a third terminal 24 and a fourth terminal 26. Here, the resistor 12 can be connected between the first terminal 20 and the third terminal 24. The second terminal 22 and the fourth terminal 26 can each be connected to a reference potential terminal 28, such as a ground terminal. An input voltage $u_{in}$ can be applied between the first terminal 20 and the second terminal 22, while the output voltage $u_{out}$ can be applied between the third terminal 24 and the fourth terminal 26.

In embodiments, the current adjustment circuit 18 can be a current regulation circuit 18 that is configured to regulate the current i through the resistor 12 in dependence on the output voltage $u_{out}$.

Figure 1B:
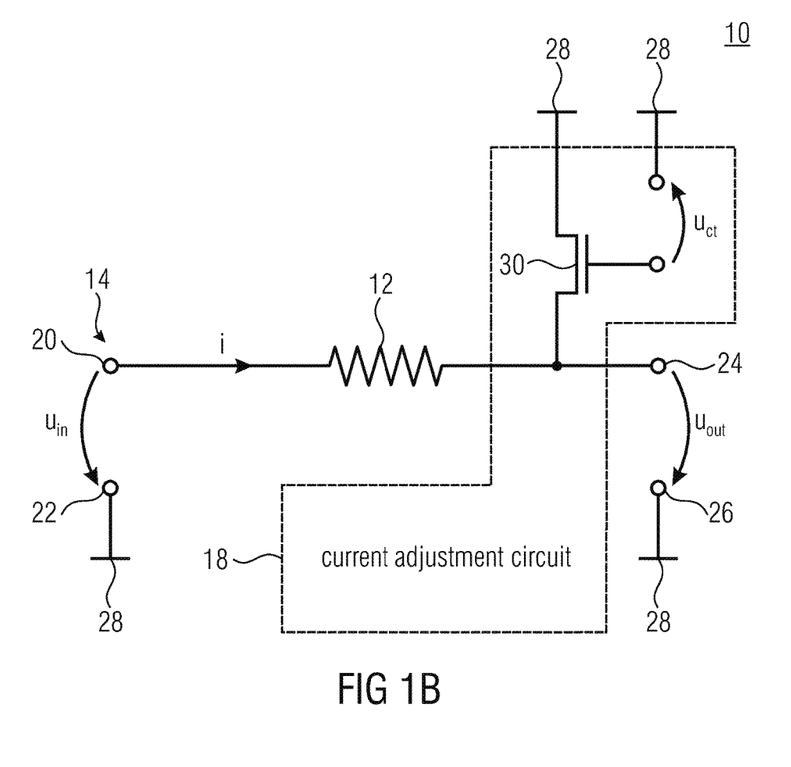
FIG. 1b is a schematic block diagram of a level converter circuit according to an embodiment of the present invention.

FIG. 1b shows a schematic block diagram of a level converter circuit 10 according to an embodiment of the present invention. As can be seen in FIG. 1b, the current adjustment circuit 18 can comprise a transistor 30 that is configured to influence the current i through the resistor 12.

The transistor 30 can be connected between an output side terminal of the resistor 12 or the output 16 (e.g. the third terminal 24) and a reference potential terminal 28.

The current adjustment circuit 18 can, for example, be configured to provide a control voltage $u_{ct}$ for the transistor 30 such that the control voltage $u_{ct}$ of the transistor 30 depends on the output voltage $u_{out}$.

Figure 2A:
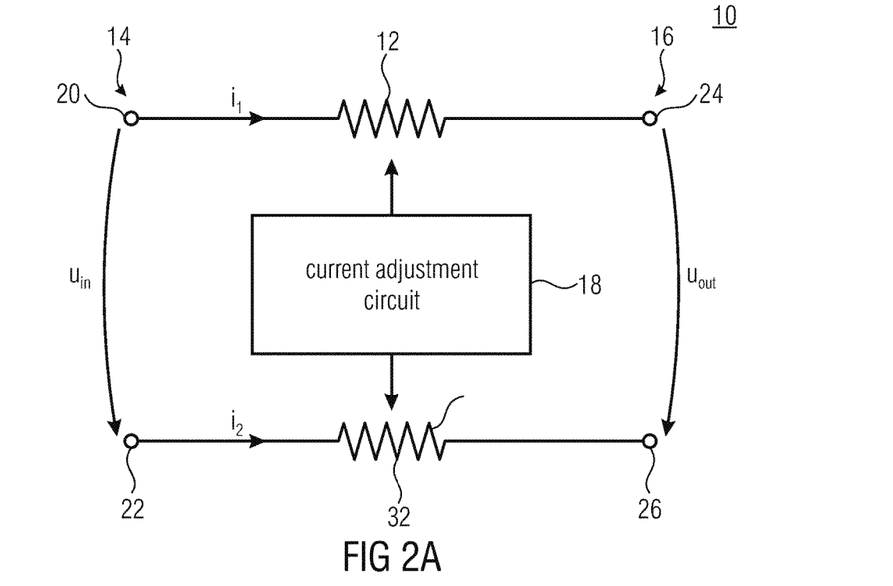
FIG. 2a is a schematic block diagram of a level converter circuit according to an embodiment of the present invention.

FIG. 2a shows a schematic block diagram of a level converter circuit 10 according to a further embodiment of the present invention. The level converter circuit 10 comprises the input 14 with the first terminal (e.g. positive input terminal) 20 and the second terminal (e.g. negative input terminal) 22, the output 16 with the third terminal (e.g. positive output terminal) 24 and the fourth terminal (e.g. negative output terminal) 26. Further, the level converter circuit 10 comprises the first resistor 12 connected between the first terminal 14 and the third terminal 24, and a second resistor 32 connected between the second terminal 22 and the fourth terminal 26. Further, the level converter circuit 10 comprises the current adjustment circuit 18 that is configured to influence the current $i_1$ through the first resistor 12 and a current $i_2$ through the second resistor 32 such that the output voltage $u_{out}$ of the level converter circuit 10 does not exceed a maximum allowable value.

The current adjustment circuit 18 can be a current regulating circuit 18 that is configured to regulate the current $i_1$ through the first resistor 12 and the current $i_2$ through the second resistor 32 based on the output voltage $u_{out}$.

Figure 2B:
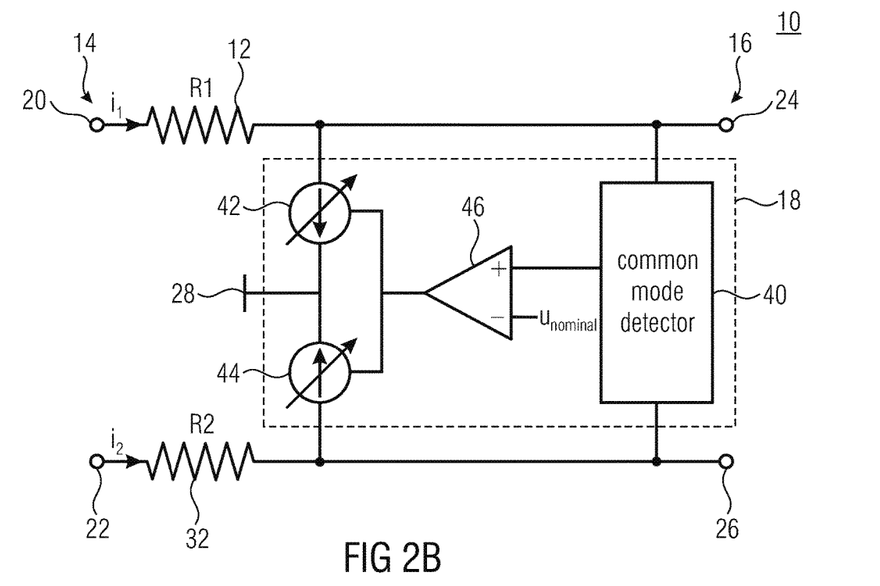
FIG. 2b is a schematic block diagram of a level converter circuit according to an embodiment of the present invention.

FIG. 2b shows a level converter circuit 10 according to a further embodiment of the present invention. As can be seen in FIG. 2b, the current adjustment circuit 18 can comprise a common mode detector 14 that is configured to determine a common mode level of the output voltage $u_{out}$ (applied between the third terminal 24 and the fourth terminal 26), wherein the current regulating circuit 18 is configured to regulate the current $i_1$ through the first resistor 12 (R1) and the current $i_2$ through the second resistor 32 (R2) in dependence on the determined common mode level of the output voltage $u_{out}$.

Further, the current regulating circuit 18 can comprise controllable current or voltage sources 42 and 44 that are configured to influence the current $i_1$ through the first resistor 12 (R1) and the current $i_2$ through the second resistor 32 (R2). Here, the current regulating circuit 18 can be configured to control a nominal value of the controllable current or voltage sources 42 and 44 in dependence on the determined common mode level of the output voltage $u_{out}$.

For example, a first controllable current or voltage source 42 of the controllable current or voltage sources 42 and 44 can be connected between an output side terminal of the first resistor 12 (R1) and a reference potential terminal 28, while a second current or voltage source 44 of the controllable current or voltage sources 42 and 44 can be connected between an output side terminal of the second resistor 32 (R2) and the reference potential terminal 28.

Further, the current regulating circuit 18 can comprise an operational amplifier 46, wherein a first input (e.g. positive input) of the operational amplifier 46 can be connected to the common mode detector 40 to obtain the common mode level of the output voltage $u_{out}$ determined by the common mode detector 40, wherein a second input (e.g. negative input) of the operational amplifier 46 can obtain a nominal voltage $u_{nominal}$, which is provided, for example, externally or by the current adjustment circuit 18, and wherein an output of the operational amplifier 46 can be connected to control inputs of the controllable current or voltage sources 42 and 44 to control the controllable current or voltage sources 42 and 44.

The level converter circuit 10 enables lowering of the input level to a level acceptable for the fast transistors without having to use voltage-proof slow transistors. For this, a resistor 12 or 32 is used through which a (constant or almost constant) current $i_1$ and $i_2$ flows in order to generate a defined voltage drop. It should be noted that the currents $i_1$ and $i_2$ can really (slightly) vary. Further, it can be ensured that the currents $i_1$ and $i_2$ generate a sufficient voltage drop, such that the input transistors are still within a secure operating range even when the operating voltage is not yet applied to the receiver, but the transmitting counterpart is already active.

Figure 2C:
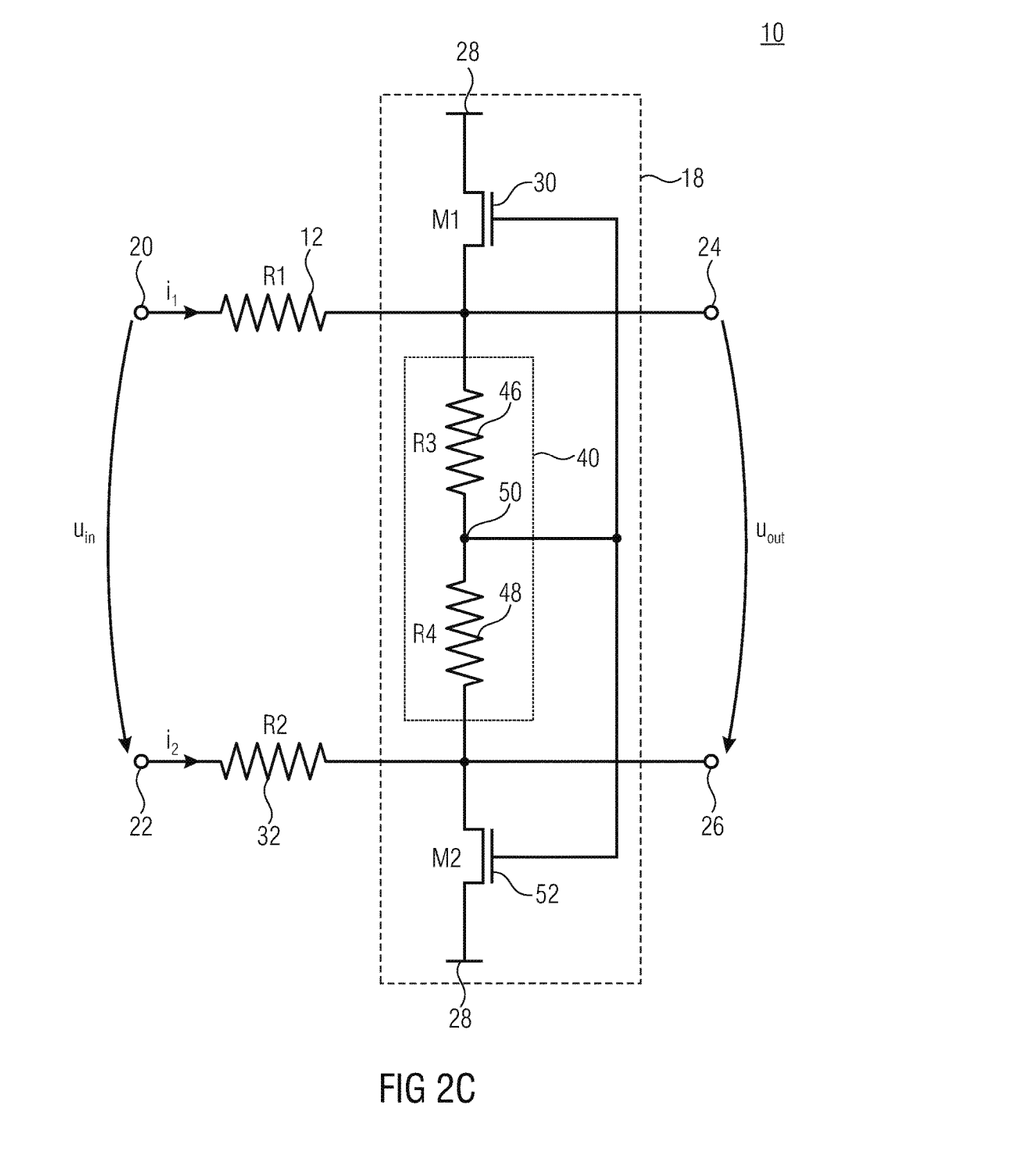
FIG. 2c is a schematic block diagram of a level converter circuit according to an embodiment of the present invention.

FIG. 2c shows a schematic block diagram of the level converter circuit 10 according to an embodiment of the present invention. As can be seen in FIG. 2c, the common mode detector 40 of the current adjustment circuit 18 can comprise a voltage divider 40 that is configured to provide the common mode level of the output voltage $u_{out}$.

The voltage divider can comprise a third resistor 46 (R3) and a fourth resistor 48 (R4) that are connected between the third terminal 24 and the fourth terminal 26. The common mode detector 40 can be configured to provide the common mode level of the output voltage $u_{out}$ at a node 50 between the third resistor 46 and the fourth resistor 48.

Here, a resistance of the first resistor 12 (R1) can be lower than a resistance of the third resistor 46 (R3) by at least a factor of 2, while a resistance of the second resistor 32 (R2) can be lower than a resistance of the fourth resistor 48 (R4) by at least a factor of 2.

The current regulating circuit 18 can comprise a first transistor 30 (M1) and a second transistor 52 (M2), wherein the first transistor 30 can be configured to influence the current $i_1$ through the first resistor 12 (R1), and wherein the second transistor 52 (M2) can be configured to influence the current $i_2$ through the second resistor 32 (R2), wherein control voltages of the first transistor 30 (M1) and the second transistor 52 (M2) depend on the determined common mode level of the output voltage $u_{out}$.

Here, the first transistor 30 (M1) can be connected between an output side terminal of the first resistor 12 (R1) or the third terminal 24 and a reference potential terminal 28, wherein the second transistor 52 (M2) can be connected between an output side terminal of the second resistor 32 (R2) or the fourth terminal 26 and a reference potential terminal 28.

The first transistor 30 (M1) and the second transistor 52 (M2) can be field-effect transistors.

Here, gates of the field-effect transistors 30 (M1) and 52 (M2) can be passively coupled, such that control voltages at the gates of the field-effect transistors 30 (M1) and 52 (M2) are based exclusively on an input voltage $u_{in}$ of the level converter circuit 10.

As has already been mentioned, the current regulating circuit 18 can comprise a common mode detector 40 that is configured to determine a common mode level of the output voltage $u_{out}$, wherein the common mode detector 40 can comprise a voltage divider that is configured to provide the common mode level of the output voltage $u_{out}$ at a center 50 of the voltage divider. Here, gates of the field-effect transistors 30 (M1) and 52 (M2) can be connected to the center 50 of the voltage divider.

In other words, FIG. 2c shows the basic structure of the level converter circuit 10 with transistors 30 (M1) and 52 (M2). The necessitated DC voltage drops in a current controlled manner across resistors 12 and 32 (R1 and R2). The resistors 46 and 48 (R3 and R4) detect the common mode level by generating, as resistive dividers, an average voltage between the third terminal 24 (e.g. positive output terminal) and the fourth terminal 26 (e.g. negative output terminal). This voltage serves as nominal quantity for the transistors 30 and 52 (M1 and M2), which draw a DC current from the resistors 12 and 32 (R1 and R2) and realize level adaptation. The level converter circuit 10 has no terminal for explicit operating voltage and hence also operates when no supply voltage is applied. It is also possible that the control voltage is controlled by more complex regulations/networks in a more fine-tuned manner in order to be able to cover an even greater input range.

In embodiments, a gate width/gate length of the transistors 30 and 52 (M1 and M2) can be selected such that the nominal voltage $U_{nominal}$ at the gates generates currents (e.g. drain current) generating the necessitated voltage drops across the resistors 12 and 32 (R1 and R2). Otherwise, the transistors 30 and 52 (M1 and M2) are independent of the successive input transistors. Here, it can be advantageous to select the gate length of transistors 30 and 52 (M1 and M2) as large as possible and the gate width of the transistors 30 and 52 (M1 and M2) as small as possible for reducing the capacitive load and for increasing the internal resistor of the current source.

Figure 3:
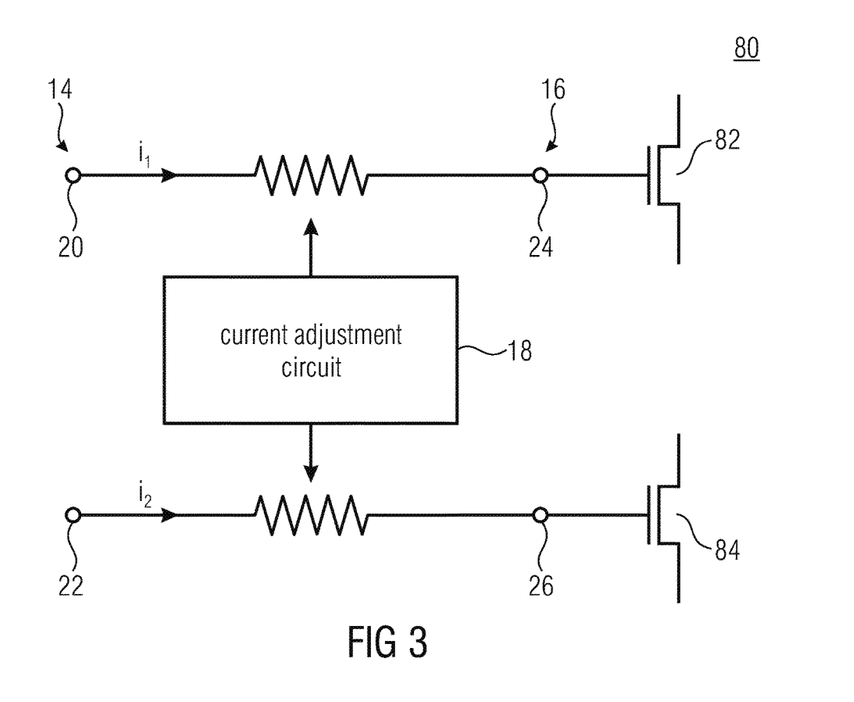
FIG. 3 is a schematic block diagram of an input circuit according to an embodiment of the present invention.

FIG. 3 shows a schematic block diagram of an input circuit 80 according to an embodiment of the present invention. The input circuit 80 comprises input transistors 82 and 84 and the level converter circuit 10. As can be seen in FIG. 3, the input transistors 82 and 84 can be coupled to the output 16 of the level converter circuit 10.

In embodiments, the input transistors 82 and 84 can be coupled directly to the output 16 of the level converter circuit 10. More accurately, a first input transistor 82 of the input transistors 82 and 84 can be connected to the third terminal 24, while a second input transistor 84 of the input transistors 82 and 84 can be connected to the fourth terminal 26 of the level converter circuit 10.

Figure 4:
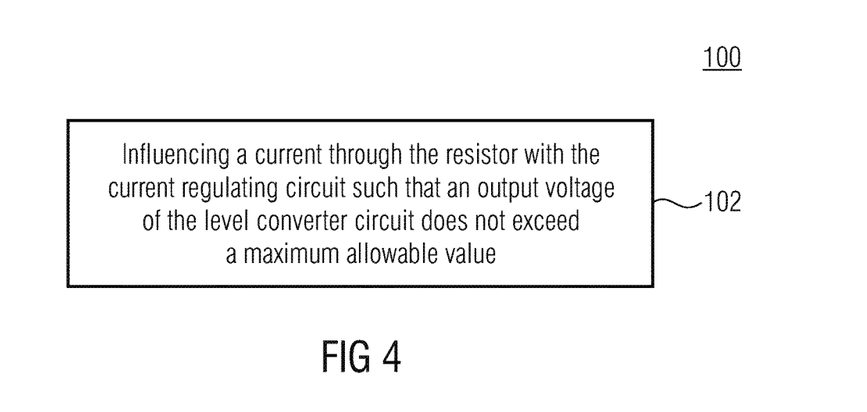
FIG. 4 is a flow diagram of a method for operating a level converter circuit according to an embodiment of the present invention.

FIG. 4 shows a flow diagram of a method 100 for operating the level converter circuit 10 according to an embodiment of the present invention. The method 100 includes influencing 102 a current through the resistor with the current regulating circuit such that an output voltage of the level converter circuit does not exceed a maximum allowable value.

Embodiments of the present invention provide an alternative level converter 10 realizing the voltage drop at a resistor 12 and 32 and allowing level conversion without usage of a slow transistor and hence without reduction of bandwidth and amplification.

The level converter circuit 10 has the advantage of a large common mode range, low bandwidth loss or good amplification of the input stage and protection of the sensitive input stage even without active operating voltage.

Figure 5:
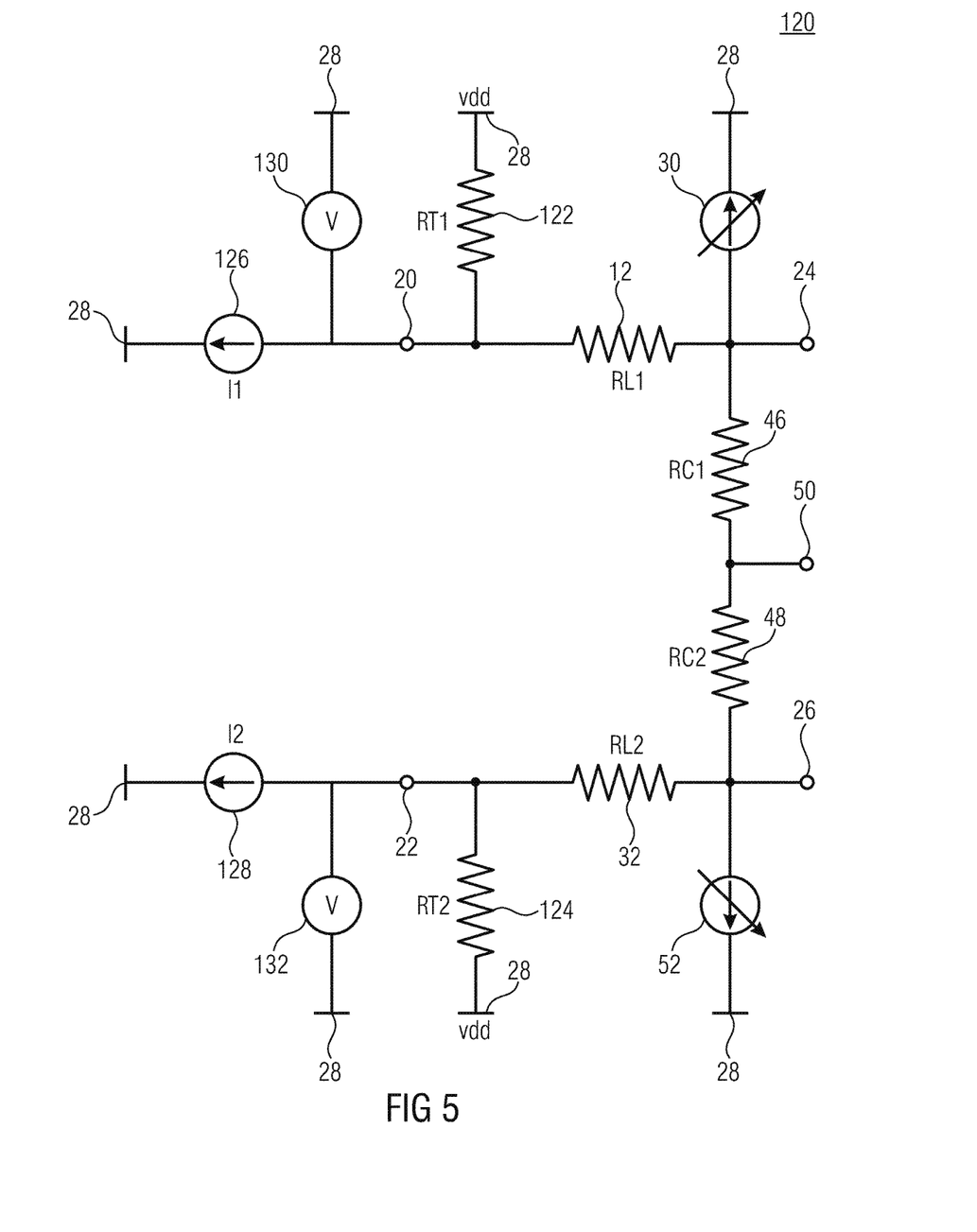
FIG. 5 is a schematic block diagram of a measurement circuit.

FIG. 5 shows a schematic block diagram of a measurement circuit 120. The measurement circuit 120 includes the level circuit 10, which comprises a first resistor 12 (RL1)

connected between a first terminal 20 and a third terminal 24, a second resistor 32 (RL2) connected between a second terminal 22 and a fourth terminal 26, a voltage divider with a third resistor 46 (RC1) and a fourth resistor 48 (RC2) connected between the third terminal 24 and the fourth terminal 26, a first controlled current source 30 connected between the third terminal 24 and a reference potential terminal 28, and a second controlled current source 52 connected between the fourth terminal 26 and the reference potential terminal 28.

Further, the measurement circuit 120 comprises a fifth resistor 122 (RT1) connected between the first terminal 20 and a reference potential terminal 28 and a sixth resistor 124 (RT2) connected between the second terminal 22 and a reference potential terminal 28. Further, the measurement circuit 120 comprises a first current source 126 connected between the first terminal 20 and a reference potential terminal 28 and a second current source 128 connected between the second terminal 22 and a reference potential terminal 28. Above that, the measurement circuit 120 comprises a first voltage meter 130 connected between the first terminal 20 and a reference potential terminal 28 and a second voltage meter 132 connected between the second terminal 22 and a reference potential terminal 28.

Since the circuit draws current directly from the termination resistors 122 and 124 (RT1 and RT2), the voltage drop at these resistors can simply be measured per multimeter 130 and 132 in dependence on a impressed current which indicates a direct mode voltage at the input. 11 and 12 have to be identical. In the level converter circuit, the characteristic line of fed-in Ito measured U shows significant nonlinearities, whereas conventional input stages show linear relations.

While some aspects have been described in the context of an apparatus, it is obvious that these aspects also represent a description of the respective method, such that a block or device of an apparatus can also be considered as a respective method step or as a feature of a method step. Analogously, aspects that have been described in the context of one or as a method step also represent a description of a respective block or detail or feature of a respective apparatus. Some or all of the method steps can be performed by a hardware device (or by using a hardware device) such as a microprocessor, a programmable computer or an electronic circuit. In some embodiments, some or all of the most important method steps can be performed by such an apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A level converter circuit, comprising:
an input with a first terminal and a second terminal;
an output with a third terminal and a fourth terminal;
a first resistor connected between the first terminal and the third terminal;
a second resistor connected between the second terminal and the fourth terminal; and
a current adjustment circuit configured to influence a current through the first resistor and a current through the second resistor such that an output voltage of the level converter circuit does not exceed a maximum allowable value;
wherein the current adjustment circuit is a current regulating circuit that is configured to regulate the current through the first resistor and the current through the second resistor based on the output voltage;
wherein the current regulating circuit comprises a first transistor and a second transistor, wherein the first transistor is configured to influence the current through the first resistor, and wherein the second transistor is configured to influence the current through the second resistor, wherein control voltages of the first transistor and the second transistor depend on the determined common mode level of the output voltage;
wherein the first transistor and the second transistor are field-effect transistors, and
wherein the current regulating circuit comprises a common mode detector that is configured to determine a common mode level of the output voltage, wherein the common mode detector comprises a voltage divider that is configured to provide the common mode level of the output voltage at a center of the voltage divider, wherein gates of the field-effect transistors are connected to the center of the voltage divider.

2. The level converter circuit according to claim 1, wherein the voltage divider comprises a third resistor and a fourth resistor that are connected between the third terminal and the fourth terminal, wherein the common mode detector is configured to provide the common mode level of the output voltage at a node between the third resistor and the fourth resistor.

3. The level converter circuit according to claim 2, wherein a resistance of the first resistor is lower than a resistance of the third resistor by at least a factor of two and wherein a resistance of the second resistor is lower than a resistance of the fourth resistor by at least a factor of two.

4. The level converter circuit according to claim 1, wherein the current regulating circuit comprises controllable current or voltage sources that are configured to influence the current through the first resistor and the current through the second resistor, wherein the current regulating circuit is configured to control a nominal value of the controllable current or voltage sources in dependence on the determined common mode level of the output voltage.

5. The level converter circuit according to claim 1, wherein the first transistor is connected between an output side terminal of the first resistor or the third terminal and a reference potential terminal, and wherein the second transistor is connected between an output side terminal of the second resistor or the fourth terminal and the reference potential terminal.

6. The level converter circuit according to claim 1, wherein gates of the field-effect transistors are passively coupled, such that control voltages at the gates of the field-effect transistors are based exclusively on an input voltage of the level converter circuit.

7. An input circuit comprising:
input transistors; and
the level converter circuit according to claim 1;
wherein the input transistors are coupled to the output of the level converter circuit.

8. The input circuit according to claim 7, wherein the input transistors are directly coupled to the output of the level converter circuit.

9. Method for operating a level converter circuit, wherein the level converter circuit comprises an input with a first terminal and a second terminal, an output with a third terminal and a fourth terminal, a first resistor connected between the first terminal and the third terminal, a second resistor connected between the second terminal and the fourth terminal, and a current regulating circuit, wherein the current regulating circuit comprises a first transistor and a second transistor, wherein the first transistor and the second transistor are field-effect transistors, wherein the current regulating circuit comprises a common mode detector that is configured to determine a common mode level of the output voltage, wherein the common mode detector comprises a voltage divider, wherein gates of the field-effect transistors are connected to the center of the voltage divider, wherein the method comprises:

influencing a current through the first resistor and a current through the second resistor with the current regulating circuit such that an output voltage of the level converter circuit does not exceed a maximum allowable value;

wherein, when influencing the current through the first resistor and the current through the second resistor, the current through the first resistor and the current through the second resistor are regulated by the current regulating circuit based on the output voltage;

wherein the current through the first resistor is influenced by the first transistor, and wherein the current through the second resistor is influenced by the second transistor;

wherein control voltages of the first transistor and the second transistor depend on the determined common mode level of the output voltage;

wherein the common mode level of the output voltage is provided at a center of the voltage divider.

* * * * *